United States Patent [19]
Park et al.

[11] Patent Number: 5,396,113
[45] Date of Patent: Mar. 7, 1995

[54] ELECTRICALLY PROGRAMMABLE INTERNAL POWER VOLTAGE GENERATING CIRCUIT

[75] Inventors: Yong-Bo Park, Kyungki; Byeong-Yun Kim; Hyung-Kyu Lim, both of Seoul, all of Rep. of Korea

[73] Assignee: SamSung Electronics Co., Ltd., Kyungki, Rep. of Korea

[21] Appl. No.: 922,549

[22] Filed: Jul. 31, 1992

[30] Foreign Application Priority Data

Aug. 19, 1991 [KR] Rep. of Korea ................ 1991-14265

[51] Int. Cl.⁶ .......................... H03K 3/01; G11C 7/00
[52] U.S. Cl. ................ 327/543; 365/189.09; 365/198; 365/226; 327/546; 327/538; 327/530
[58] Field of Search .............. 365/189.04, 198, 226, 365/227, 228, 229, 207, 208; 307/296.1, 296.5, 296.6, 296.8, 350, 530, 296.2, 296.4, 354, 362

[56] References Cited

U.S. PATENT DOCUMENTS

| | | | |
|---|---|---|---|
| 4,095,164 | 6/1978 | Ahmed | 323/8 |
| 4,398,833 | 6/1983 | Tzang | 323/280 |
| 4,670,861 | 6/1987 | Shu et al. | 365/226 |
| 4,797,377 | 1/1989 | Hing | 307/297 |
| 4,868,483 | 9/1989 | Tsujimoto | 323/313 |
| 4,974,207 | 11/1990 | Hashimoto | 365/207 |
| 5,046,052 | 9/1991 | Miyaji et al. | 365/189.09 |
| 5,063,304 | 11/1991 | Iyengar | 365/189.09 |
| 5,121,007 | 6/1992 | Aizaki | 307/296.5 |
| 5,128,863 | 7/1992 | Nakamura et al. | 365/228 |
| 5,189,316 | 2/1993 | Murakami et al. | 307/296.6 |
| 5,254,880 | 10/1993 | Horiguchi et al. | 307/296.8 |
| 5,258,950 | 11/1993 | Murashima et al. | 365/226 |
| 5,321,653 | 6/1994 | Suh et al. | 307/296.8 |

*Primary Examiner*—Timothy P. Callahn
*Assistant Examiner*—Trong Phan
*Attorney, Agent, or Firm*—Robert E. Bushnell

[57] ABSTRACT

An internal power voltage generating circuit of a semiconductor memory device may be constructed with a voltage sensing circuit (100) and a reference voltage controller (300) providing an internal power voltage int. $V_{CC}$ of a given reference voltage amplitude $V_{ref}$ and an external power voltage amplitude ext. $V_{CC}$. Thus, when a high voltage over an operating voltage of a chip is applied to a pad (10) of the chip, the internal power voltage is raised to the level of the external power voltage. Therefore, when stress is added to the chip during a "burn-in-test", the defective chip is easily detected. Consequently, the reliability of those semiconductor memory devices subjected to post-manufacturing testing can be improved.

34 Claims, 3 Drawing Sheets

ELECTRICALLY PROGRAMMABLE INTERNAL POWER VOLTAGE GENERATING CIRCUIT

BACKGROUND OF THE INVENTION

The present invention relates to semiconductor memory devices, and more particularly, to electrically programmable internal power voltage generating circuits.

As the degree of integration of semiconductor memory devices has increased, the size of elements such as transistors constituting those memory devices has been reduced. Accordingly, if a voltage from an external power source is applied across such reduced size transistors without any conversion, that transistor may be subjected to the occurrence of strong electric fields and stress. This may result in an increase in defects in each of those transistors. Hence, in a highly integrated semiconductor memory device larger than sixteen megabytes, an internal power voltage generating circuit should be used which reduces the amplitude of the voltage from an external power voltage to an internal power voltage of a given amplitude suitable for the memory device. For example, when the external power voltage is approximately five volts, an internal power voltage with an amplitude of approximately four volts is used. The internal power voltage together with the external power voltage have yet to be lowered in currently available memory devices over sixteen megabytes. In order to reduce the amplitude of the external power voltage to the amplitude of the internal power voltage, an internal power voltage generating circuit is required for uniformly providing the internal power voltage within the chip.

In conventional internal power voltage generating circuits, a reference voltage generator will generate a reference voltage so that an internal power voltage of a desired amplitude can be produced. A comparator such as a differential amplifier then compares the amplitude of the internal power voltage with the reference voltage in order to control the amplitude of the internal power voltage provided to devices within the chip. A driver will then convert an external power voltage, into an internal power voltage, in response to the control of the comparator. The internal power voltage, provided at the output terminal of the driver is thus applied to each memory device on the chip connected to one input terminal of the comparator. Therefore, in each memory device, the internal power voltage produced at the output terminal of driver will be sensed by the comparator, and will be applied to each memory device on that chip which is simultaneously corrected to that input terminal of the comparator. Consequently, in each of those memory devices connected to the comparator, the amplitude of the interval voltage as lowered to a given level is then sensed by the comparator, and output voltage of the comparator is adjusted for example, to a lower amplitude in order to again control the voltage of the internal power from the devices within the chip.

So long as a voltage from an external power source is supplied to such a conventional semiconductor memory device, the internal power voltage generating circuit operates and the constant internal power voltage is provided as long as the amplitude of the voltage provided by the external power source is above a constant amplitude. It is often necessary however, to have an internal power voltage supplied to each circuit of the chip at an amplitude equal to that of the external power voltage, as for example, during a reliability test of the chip. When manufacture of the chip is completed, a "burn-in test" is usually performed by the more conscientious semiconductor manufacturers in order to detect any defects within the chip. The "burn-in test" is a test in which a high voltage in excess of a regulated external power voltage of the chip is applied to each device constituting the chip, for a long time at a high temperature in order to detect defective devices within the chips. Since the stress applied to each device constituting a chip is increased, defective chips should theoretically be easily detected. With currently available semiconductor devices however, even though the amplitude of the external voltage is raised, a voltage applied to the chip will not be raised above the internal power voltage. Therefore, an effective and reliable "burn-in test" can not be performed and a defective chip can not be easily detected; the manufacturer will consequently have a lower reliability among the semiconductor memory devices shipped to customers after being subjected to the ineffective "burn-in test."

SUMMARY OF THE INVENTION

It is therefore, an object of the present invention to provide an improved semiconductor memory device.

It is another object to provide a semiconductor memory device with an improved internal power voltage generating circuit.

It is yet another object to provide an internal power voltage generating circuit capable of accommodating electrical programming of the amplitude of a voltage provided b y an internal power generating circuit.

It is still another object to provide an electrically programmable internal power voltage generating circuit capable of furnishing an internal voltage having the same amplitude as a given voltage or an external power voltage.

It is still yet another object to provide an internal power voltage generating circuit capable of permitting electrical programming of the amplitude of the voltage provided by the internal power voltage generating circuit to enable the internal voltage to rise to the same amplitude as either a given voltage or the amplitude of the voltage provided by an external power source.

In order to achieve these and other objects, according to one aspect of the present invention a semiconductor memory device may be constructed with a reference voltage generator, a driver circuit with one terminal of a channel connected to an external power source generating a given internal power voltage, and a differential amplifier connected to receive outputs of a reference voltage generator and the internal power voltage, and to transfer the internal power voltage to a control terminal of the driver circuit. The internal power voltage generating circuit may include a voltage sensing circuit and a reference voltage controller. The voltage sensor senses a voltage applied to a given pad and generates a first or second output in dependence upon the sensed voltage level. Moreover, the reference voltage controller generates potential from the reference voltage generator to a first or second potential in dependence upon the first or second output from the voltage sensor, with the first and second outputs, that is logic "high" and "low" levels respectively, or logic "low" and "high" levels respectively, being complementary to each other. The first and second potentials may be the external power voltage and reference voltage respectively, or the reference voltage and external power voltage respectively.

BRIEF DESCRIPTION OF THE DRAWINGS

For a better understanding of the invention, and to show how the same may be carried into effect, reference will now be made to the following detailed description, in conjunction with the accompanying diagrammatic drawings, in which.

DETAILED DESCRIPTION OF THE PREFERRED EMBODIMENT

Figure 1:
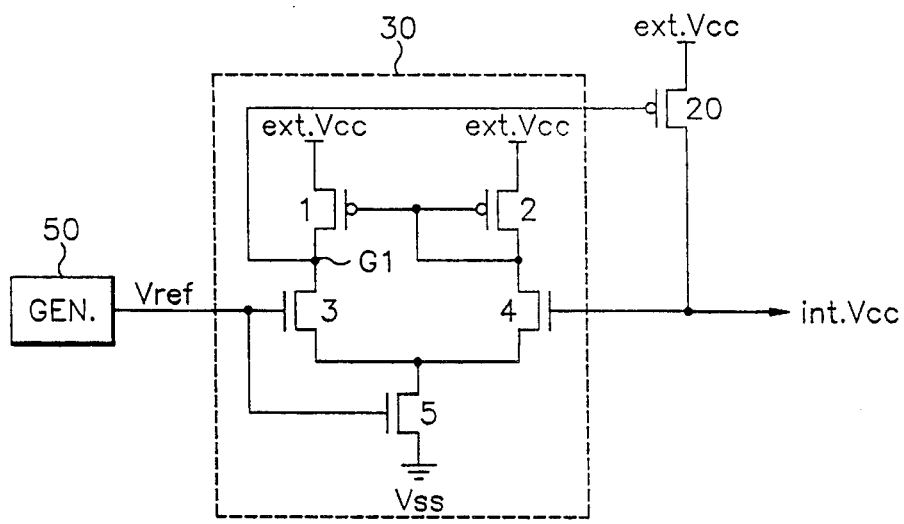
FIG. 1 is a circuit diagram of a conventional internal power voltage generating circuit.

Turning now to the drawings, FIG. 1 is a circuit diagram of a conventional internal power voltage generating circuit. A reference voltage generator 50 generates a reference voltage $V_{ref}$ so that a desired internal power voltage can be produced. A comparator 30 in the form of a differential amplifier compares the internal power voltage into $V_{CC}$ with the reference voltage $V_{ref}$ in order to control output of the internal power voltage. A single transistor driver 20 converts an external power voltage, ext. $V_{CC}$, into an internal power voltage, int. $V_{CC}$, in response to the control of the comparator 30. The internal power voltage, int. $V_{CC}$, provided at the output terminal of driver 20 is applied to each memory device (not shown in FIG. 1) on the chip connected to the gate of transistor 4 serving as one input terminal of the comparator 30. Therefore, in each memory device, the internal power voltage, int. $V_{CC}$, produced at the output terminal of driver 20 is sensed by comparator 30, and is applied to each memory device (not shown in FIG. 1) on the chip which are connected in common to comparator 30. Therefore, in each of those memory devices connected to comparator 30, the interval voltage int. $V_{CC}$ is lowered to a given amplitude is then sensed by comparator 30, and output voltage of the comparator 30 i.e., the potential level at node G1, goes to a lower amplitude with the result that driver 20 is made more conductive and the amplitude of the internal power voltage int. $V_{CC}$ is again compensated.

In the semiconductor memory device of FIG. 1, if only a power voltage is supplied, the internal power voltage generating circuit is operated and the constant internal power voltage int. $V_{CC}$ is produced as long as the amplitude of the external power voltage ext. $V_{CC}$ is above a constant level. It is often necessary to have an internal power voltage, int. $V_{CC}$, supplied to each circuit of the chip at a level of the external power voltage, ext. $V_{CC}$, as for example, during a reliability test of the chip. When manufacture of the chip is completed, a "burn in test" is performed to detect the defects of the chip. With currently available semiconductor devices, even though the external power voltage ext. $V_{CC}$ is raised, a voltage applied to the chip is not raised above the internal power voltage, int. $V_{CC}$. Therefore, the effective "burn in test" may not be performed and a defective chip is not easily detected with a resulting lower reliability among semiconductor memory devices shipped to customers after testing.

Figure 2:
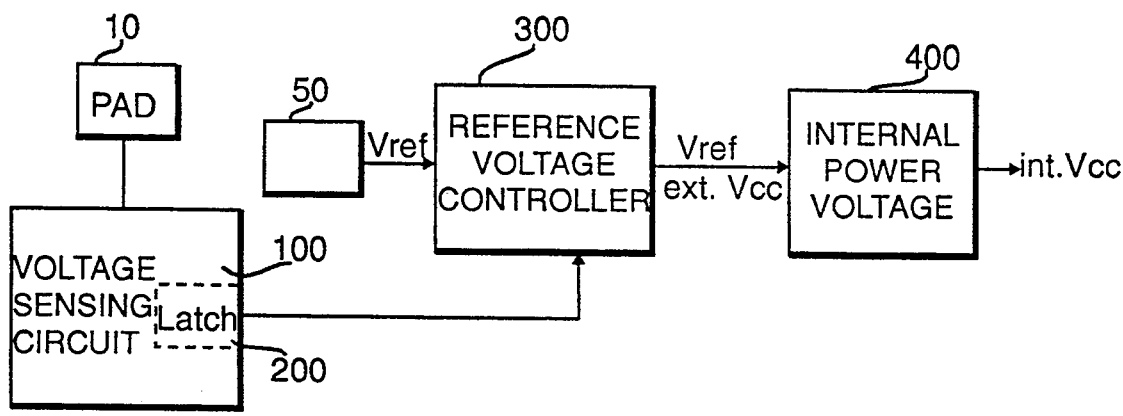
FIG. 2 is a block diagram of an internal power voltage generating circuit according to one example of a preferred embodiment of the present invention.

Referring now to FIG. 2, an internal power voltage generating circuit includes a voltage sensing circuit 100, a latch circuit 200, a reference voltage controller 300 and an internal power voltage generator 400. The voltage sensing circuit 100 is connected to a pad 10 of the chip to which a pin is coupled to sense the voltage applied to pad 10. The latch circuit 200 continuously latches the voltage sensed by the voltage sensing circuit 100. The reference voltage controller 300 transfers or blocks a reference voltage $V_{ref}$ produced from a reference voltage generator 50, and is connected to the internal power voltage generator 400. The voltage of an external power voltage, ext. $V_{CC}$, is applied to the reference voltage controller 300. The internal power voltage generator 400 receives either one of the reference voltage $V_{ref}$ or the external power voltage and provides an internal power voltage, int. $V_{CC}$.

Figure 3:
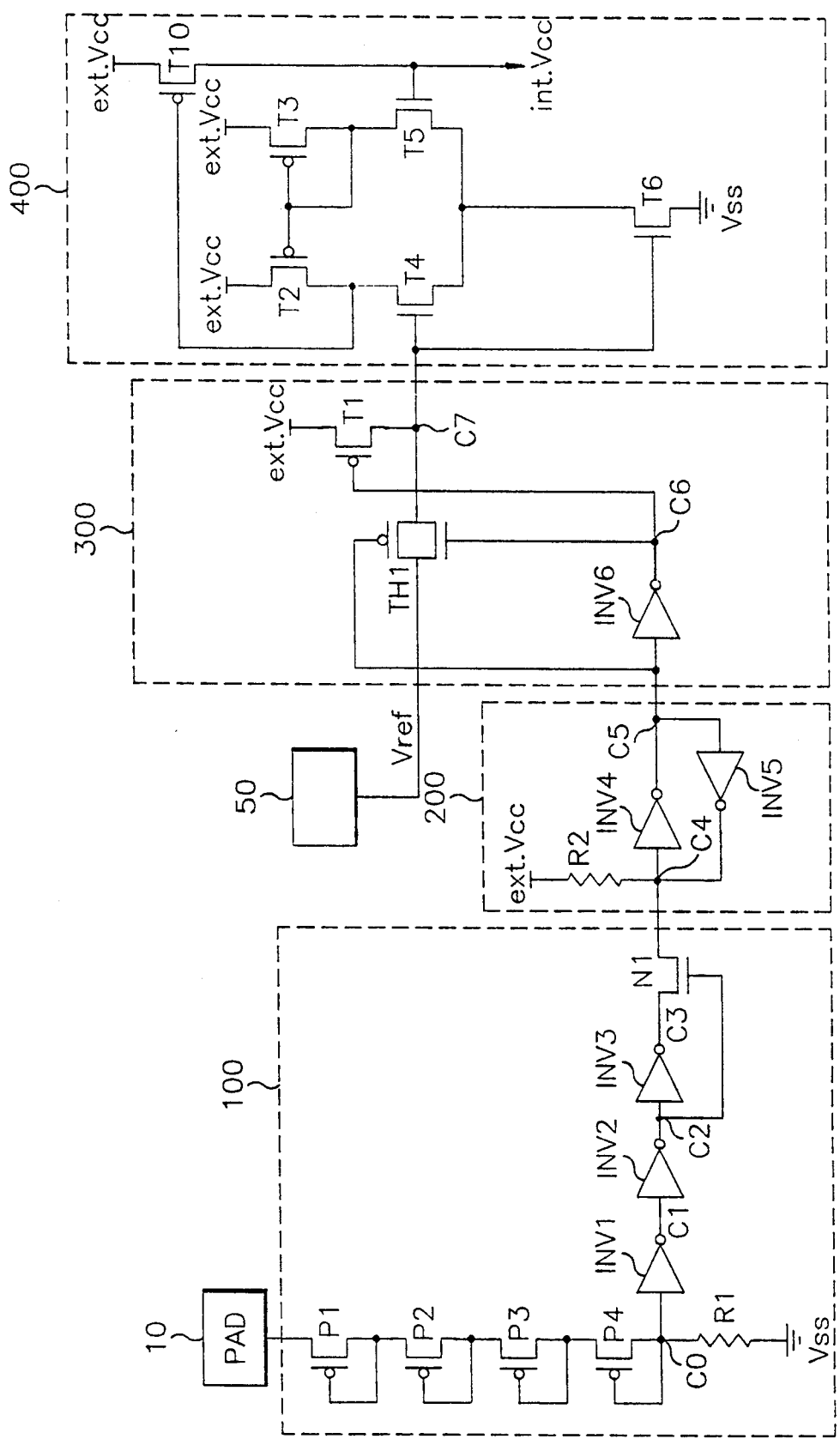
FIG. 3 is a circuit diagram of the internal power voltage generating circuit shown in FIG. 2.

Referring to FIG. 3, the voltage sensing circuit 100 has a serial array of first, second, third and fourth PMOS transistors P1, P2, P3 and P4 for lowering a voltage level applied to the pad 10, resistor R1 connected between one terminal of a channel of the fourth PMOS transistor P4 and a local ground voltage $V_{SS}$. First, second and third inverters INV1, INV2 and INV3 are serially connected between a common terminal at the node $C_0$ formed by the fourth PMOS transistor P4 and resistor R1, and an electrically conductive electrode of the channel switching transistor N1. The gate of transistor N1 is connected between a node $C_2$ formed between the output terminal of the second inverter INV2 and input terminal of the third inverter INV3. PMOS transistors P1 through P4 may be different in respective channel size and in number, in dependence upon the variation of the internal power voltage. Also the number of the inverters INV1 through INV3 may be varied in dependence upon the logic state or amplifying operation. Moreover, each inverter is preferably constructed using CMOS circuitry.

Latch circuit 200 is shown with a resistor R2 connected to an external power source voltage ext. $V_{CC}$, and inverters INV4 and INV5 coupled back-to-back for transferring and latching a potential received through the resistor R2. Thus, the output signal of latch circuit 200 is continuously supplied to the reference voltage controller 300. The reference voltage controller 300 is shown with a transmission gate TH1 having a control terminal connected to receive the output signal of the latch circuit 200, an inverter INV6 and a pull-up transistor T1. The pull-up transistor T1 is turned on only when the transmission gate TH1 is turned off by the output signal of latch circuit 200 to raise the voltage of a node $C_7$ to the level of the external power voltage ext. $V_{CC}$. Node $C_7$ is connected to an input terminal of the internal power voltage generator 400. In order provide protection from either signal noise in the external power voltage ext. $V_{CC}$ or an undesirably high voltage applied to the pad 10, pull-up transistor T1 is turned on only when a nearly direct voltage is applied to the pad 10. Therefore, pull-up transistor T1 must be considerably smaller in size than other transistors in the circuits. The reference voltage generator 50 and the internal power voltage generator 400 are of generally known construction; accordingly, no further description for these components will be given.

An example of the operation of the circuit shown in FIG. 3 will now be described.

First, a description is given in the situation where either no voltage is applied to pad 10 or the amplitude of the voltage applied to pad 10 does not exceed 5.5 volts in a semiconductor device of less than sixteen megabytes during a normal operation of the device. Node $C_0$ is set to logic "low" level through the PMOS transistors P1 to P4. Usually, the threshold voltage of one PMOS transistor is about one volt. Therefore, nodes $C_1$, $C_2$ and $C_3$ are set to logic "high", "low" and "high" levels, respectively, and the switching transistor $N_1$ is turned off. Node $C_4$ of latch circuit 200 is set to logic "high" level by resistor $R_2$ and this logic "high" level is latched by inverters INV4 and INV5. Here, at node $C_4$, a signal of logic "high" level is continuously latched regardless of changes in the output of the voltage sensing circuit 100. Node $C_5$, therefore, remains at a logic "low" level. The transmission gate TH1 of the reference voltage controller 300 is turned on by the logic "low" level of the latch circuit 200, and provides the reference voltage $V_{ref}$ produced from the reference voltage generator 50 to the internal power voltage generator 400. Moreover, pull-up transistor T1 is turned off by the "high" level of node $C_6$. Then, the internal power voltage generator 400 produces a constant internal power voltage int. $V_{CC}$ corresponding to the reference voltage $V_{ref}$.

Figure 4:
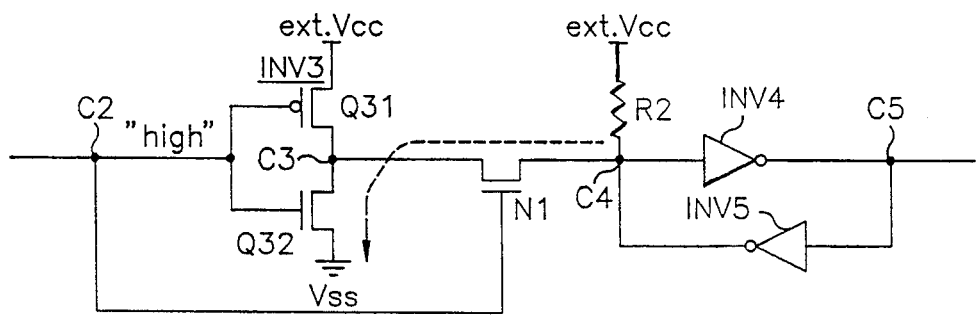
FIG. 4 is a partial, more detailed circuit diagram illustrating an example of operation of the circuit of FIG. 3.

In the situation in which a high voltage, over 5.5 V, is applied to the pad 10, node $C_0$ of voltage sensing circuit 100 is set to logic "high" level through PMOS transistors P1 to P4. Hence, nodes $C_1$, $C_2$ and $C_3$ are set to logic "low", "high" and "low" levels, respectively, and switching transistor N1 is turned on by the "high" level of node $C_2$. Then, as is shown in FIG. 4, node $C_4$ of latch circuit 200 is grounded through transistor Q32, a driving section of third inverter INV3 serially coupled between ext $V_{CC}$, node $C_3$ and $V_{SS}$ and a channel (which is in a conducting state) of switching transistor N1. Since node $C_4$ of latch circuit 200 is at a logic "low" level, node $C_5$ is set to logic "high" level. As a result, latch circuit 200 generates logic "high" level signals, thereby turning OFF transmission gate TH1. At this time, even if the voltage applied to pad 10 is lowered or disconnected, latch circuit 200 continuously produces a signal of logic "high" level. Thus, since transmission gate TMH of reference voltage controller 300 is turned off, reference voltage $V_{ref}$ generated by reference voltage generator 50 is not received by the internal power voltage generator 400. Moreover, pull-up transistor T1 is turned on and charges node $C_7$ to a potential level of the external power voltage ext. $V_{CC}$. Therefore, the output of reference voltage controller 300 goes to the amplitude of the external power voltage ext. $V_{CC}$. The external power voltage ext. $V_{CC}$ is transferred to an input terminal of a differential amplifier in internal power voltage generator 400. Then, a driver T10 is turned on by the operation of the differential amplifier and produces the internal power voltage int. $V_{CC}$ having the amplitude of the external power voltage ext. $V_{CC}$. Thereafter, regardless of whether the voltage applied to pad 10 is changed or disconnected, the internal power voltage, int. $V_{CC}$, is generated at the amplitude of the external power voltage, ext. $V_{CC}$. In other words, if a user supplies to pad 10 of the chip, a high voltage in excess of a regulated value, the internal power voltage int. $V_{CC}$ is raised to the level of the external power voltage ext. $V_{CC}$. Consequently, the user can freely produce either an internal power voltage int. $V_{CC}$ of four volts during normal operation, or about five volts of external power voltage, ext. $V_{CC}$, during testing, under control of the amplitude of the voltage applied to pad 10.

Figure 5:
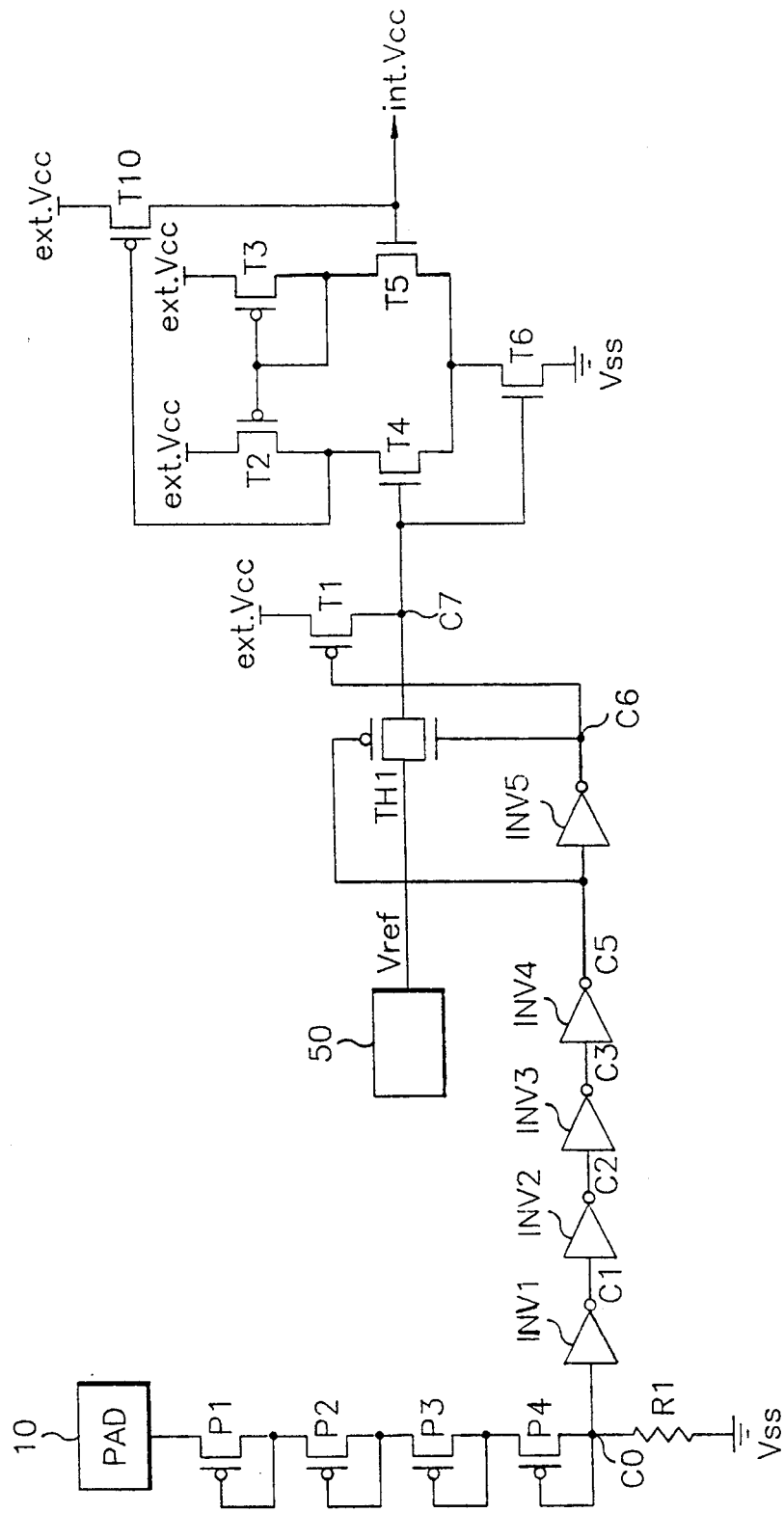
FIG. 5 is a circuit diagram of an internal power voltage generating circuit according to another example of a preferred embodiment of the present invention.

Referring now to FIG. 5, in another embodiment of the present invention the internal power voltage generating circuit does not include latch circuit 200 shown in the embodiment represented by FIG. 3. Therefore, only when a voltage in excess of 5.5 V is applied to pad 10 is the internal power voltage, int. $V_{CC}$, raised to the amplitude of the external power voltage, ext. $V_{CC}$. In other words, since there is no latch circuit, a voltage in excess of about 5.5 V must be continuously applied to pad 10 in order for internal power voltage generator 400 to raise the internal power voltage int. $V_{CC}$ to the same amplitude as the external power voltage ext. $V_{CC}$. Hence, in the circuit of FIG. 3, once a high voltage in excess of 5.5 V is applied to pad 10, the internal power voltage, int. $V_{CC}$, is continuously maintained at the amplitude of the external power voltage, ext. $V_{CC}$. In the circuit of FIG. 3 therefore, even if the voltage applied to pad 10 is disconnected, all external power voltages ext $V_{CC}$ must be completely disconnected from pad 10 in order for the internal power voltage, int. $V_{CC}$ to be set to the amplitude of reference voltage $V_{ref}$. In the circuit of FIG. 5 however, the internal power voltage int. $V_{CC}$ is controlled by only the voltage applied to pad 10. Furthermore, even if the operating voltage of a highly integrated semiconductor memory device is lowered, by adjusting transistors P1–P4 of the voltage sensing circuit, the amplitude of a voltage applied to the pad and sensed by the voltage sensing circuit, can be controlled.

In the foregoing description of examples of an internal power voltage generating circuit which may be readily integrated into the monolithic structure of each integrated semiconductor device, the amplitude of the internal power voltage is electrically programmed so as to have the same amplitude as either a given reference voltage or external power voltage. Therefore, defective chips can be easily detected by applying the external power voltage to the interior of the chip during a "burn-in test", and the reliability of the semiconductor memory devices subjected to testing will be greatly improved.

While preferred embodiments of the present invention have been particularly shown and described, it will be understood by those skilled in the art that foregoing and other changes in form and details may be made without departing from the spirit and scope of the present invention.

What is claimed is:

1. An internal power voltage generating circuit of a semiconductor device, said internal power voltage generating circuit comprising:
   voltage sensing means having a pad terminal, for generating sensed voltage signals in dependence upon amplitude of voltage applied to said pad terminal;
   reference voltage controlling means for selecting one of a reference voltage and an external voltage in dependence upon said sensed voltage signals; and
   internal power voltage generating means for controlling amplitude of an internal voltage within said semiconductor device in dependence upon either one of said reference voltage and said external power voltage provided by said reference voltage controlling means.

2. The internal power voltage generating circuit of claim 1, wherein said voltage sensing means comprises:
- at least one diode-connected MOS transistor connected between said pad terminal and a first node;
- a resistor connected between said first node and a ground terminal; and
- a plurality of serially connected inverters connected between said first node and said reference voltage controlling means.

3. The internal power voltage generating circuit of claim 2, wherein said at least one diode-connected MOS transistor comprises a PMOS transistor.

4. The internal power voltage generating circuit of claim 2, wherein said inverters comprise CMOS inverter circuits.

5. The internal power voltage generating circuit of claim 1, wherein said reference voltage controlling means comprises:
- a reference voltage terminal disposed to receive said reference voltage;
- a transmission gate having a channel connected between said reference voltage terminal and said internal power voltage generating means; and
- pull-up means for providing said external power voltage to said internal power voltage generating means in dependance upon said sensed voltage signals.

6. The internal power voltage generating circuit of claim 5, wherein said pull-up means comprises a PMOS transistor.

7. The internal power voltage generating circuit of claim 1, wherein said internal power voltage generating means comprises:
- differential amplifier means for receiving said internal power voltage and one of said reference voltage and said external power voltage; and
- driver means for generating said internal power voltage in response to said comparisons.

8. The internal power voltage generating circuit of claim 1, further comprising latching means connected between said voltage sensing means and said reference voltage controlling means, for latching said sensed voltage signals, said latching means comprising a resistor connected between an external power voltage terminal and a latch input node, for pulling up a voltage of said latch input node.

9. The internal power voltage generating circuit of claim 8, wherein said voltage sensing means further comprises a transistor having a principal electrical conduction channel providing a connection between said voltage sensing means and said latching means.

10. An internal power voltage generating circuit of a semiconductor memory device, said internal power voltage generating circuit comprising:
- reference voltage generator means for generating a reference voltage;
- driving circuit means for generating an internal power voltage in dependence upon one of an external power voltage and said reference voltage;
- differential amplifier means for controlling said driving circuit means in response to comparisons of a selected voltage and said internal power voltage;
- voltage sensing means having a pad terminal, for responding to a sensed voltage by sensing a voltage applied to said pad terminal and generating one of a logic high output and logic low output in dependence on the sensed voltage; and
- reference voltage controlling means for providing one of said reference voltage and said external power voltage to said differential amplifier means as said selected voltage in response to a received one of said logic high output and said logic low output.

11. The internal power voltage generating circuit of claim 10, further comprising latching means connected between said voltage sensing means and said reference voltage controlling means, for latching said logic high output and said logic low output.

12. The internal power voltage generating circuit of claim 10, wherein said voltage sensing means comprises:
- at least one diode-connected PMOS transistor serially connected between said pad terminal and a first node;
- a resistor connected between said first node and a ground terminal; and
- a plurality of series connected inverters connected between said first node and said reference voltage controlling means.

13. The internal power voltage generating circuit of claim 12, wherein an output of said plurality of series connected inverters has a complementary value indicating whether a voltage applied to said pad is one of less than a threshold voltage and greater than said threshold voltage.

14. The internal power voltage generating circuit of claim 13, wherein said voltage sensing means further comprises switching means having an electrically conducting channel formed between an output of a last inverter of said plurality of series connected inverters and said reference voltage controlling means, for enabling and disabling outputs generated by said plurality of series connected inverters.

15. The internal power voltage generating circuit of claim 10, wherein said reference voltage controlling means comprises:
- a transmission gate having a control terminal connected to receive said logic high output and logic low output from said voltage sensing means and having a principal electrically conducting channel formed between an output line of said reference voltage generator and an input line of said differential amplifier; and
- means for providing said input line of said difference amplifier with said external power voltage when said transmission gate is turned off by said voltage sensing means.

16. The internal power voltage generating circuit of claim 10, wherein said logic high output and said logic low output are generated in response to whether said sensed voltage exceeds 5.5 volts.

17. The internal power voltage generating circuit of claim 10, wherein an amplitude of said internal power voltage is controlled to be approximately equal to said external power voltage by said differential amplifier means when said low logic output is generated by said voltage sensing means.

18. An internal power voltage generating circuit of a semiconductor memory device, said internal power voltage generating circuit comprising:
- internal power voltage generator means for controlling amplitude of an internal power voltage in response to a selected voltage;
- voltage sensing means for generating voltage sensed signals indicative of a voltage at a voltage sensing input terminal; and reference voltage controlling means for providing one of a reference voltage and a second voltage as said selected voltage in response to said voltage sensed signals.

19. The internal power voltage generating circuit of claim 18, wherein said voltage sensing means comprises:
a plurality of diode connected transistors serially connected between said voltage sensing input terminal and a first node;
a resistance to electrical conduction connected between said first node and a ground node; and
a plurality of series connected inverters connected between said first node and said reference voltage controlling means providing said voltage sensed signals to said reference voltage generator.

20. The internal power voltage generating circuit of claim 18, wherein said voltage sensing means comprises:
a plurality of diode connected transistors serially connected between said voltage sensing input terminal and a first node;
a resistance to electrical conduction connected between said first node and a ground node;
a plurality of series connected inverters connected between said first node and a second node;
a transistor connected between said second node and a voltage sensing output terminal having a gate receiving an output of one inverter in said plurality of series connected inverters.
means for latching and providing said voltage sensed signals indicative of an amplitude of a voltage at said voltage sensing input terminal when said semiconductor memory device is powered up.

21. The internal power voltage generating circuit of claim 18, wherein said second voltage is an external power voltage.

22. A semiconductor device, comprising:
voltage sensing means for generating voltage sensed signals in dependence upon amplitude of a received voltage;
reference voltage controlling means for providing a reference potential by selecting one of a reference voltage and an external voltage in dependence upon said sensed voltage signals; and
means for controlling amplitude of an internal voltage of the semiconductor device in dependence upon amplitude of said reference potential and variation in said amplitude of said internal voltage.

23. The semiconductor device of claim 22, further comprised of latching means coupled between said voltage sensing means and said reference voltage controlling means, for maintaining said voltage sensed signals applied to said reference voltage controlling means independently of reductions in said amplitude of said received voltage.

24. The semiconductor device of claim 22, wherein said controlling means comprises differential means disposed to receive said external voltage, said reference potential and said internal voltage, for setting said amplitude of said internal voltage equal to a first value when said reference voltage controlling means selects said reference voltage, for setting said amplitude of said internal voltage equal to a second and different value when said reference voltage controlling means selects said external voltage, and for compensating for variations in said amplitude of said internal voltage.

25. The semiconductor device of claim 23, wherein said controlling means comprises differential means disposed to receive said external voltage, said reference potential and said internal voltage, for setting said amplitude of said internal voltage equal to a first value when said reference voltage controlling means selects said reference voltage, for setting said amplitude of said internal voltage equal to a second and different value when said reference voltage controlling means selects said external voltage, and for compensating for variations in said amplitude of said internal voltage.

26. A voltage generating circuit for a semiconductor memory device, comprising:
a first terminal for providing an external voltage;
an output terminal;
an input terminal for receiving an applied voltage;
voltage sensor means for generating a sensed voltage signal by sensing the applied voltage received by said input terminal;
reference voltage generator means for generating a reference voltage;
internal voltage generator means for generating an internal voltage at said output terminal, said internal voltage having an amplitude substantially equal to the amplitude of one of the external voltage and the reference voltage in dependence upon said sensed voltage signal; and
reference voltage controller means for controlling said internal voltage generator means to generate said internal voltage by regulating transmission of one of said reference voltage and said external voltage to said internal voltage generator means in dependence upon logic states of said sensed voltage signal, said reference voltage controller means comprising:
a transmission gate for enabling transmission of said reference voltage to said internal voltage generator means in dependence upon said sensed voltage signal, said transmission gate having a control electrode coupled to receive said sensed voltage signal and a principal electrically conducting channel interposed between said reference voltage generator means and said internal voltage generator means; and
a pull-up transistor for alternatively enabling transmission of said reference voltage and said external power voltage to said internal voltage generator means in dependence upon logic states of said sensed voltage signal, said pull-up transistor having a first electrode of a principal electrically conducting channel connected to said first terminal, a second electrode of said principal electrically conducting channel connected to said internal voltage generator means and a control electrode coupled to receive said sensed voltage signal.

27. The voltage generating circuit as claimed in claim 26, wherein said sensed voltage signal is representative of a logic "LOW" state when said applied voltage is smaller in amplitude than a predetermined voltage, and is representative of a logic "HIGH" state when said applied voltage is greater in amplitude than said predetermined voltage.

28. The voltage generating circuit as claimed in claim 26, wherein said voltage sensor means comprises:
a plurality of diode-connected transistors serially connected between said input terminal and a common node, for reducing an amplitude of said applied voltage;
a resistor interposed between said common node and a second terminal;

a switching transistor having a first electrode of a principal electrically conducting channel connected to said common node, a second electrode of said principal electrically conducting channel providing a switched signal upon responding to said applied voltage, and a control electrode coupled to receive said sensed voltage signal; and latching means for latching the switched signal to produce said sensed voltage signal.

29. The voltage generating circuit as claimed in claim 26, wherein said voltage sensor means comprises:

a plurality of diode-connected transistors serially connected between said input terminal and a common node, for reducing an amplitude of said applied voltage;

a resistor interposed between said common node and a second terminal; and a plurality of serially connected inverters connected to said common node, for producing said sensed voltage signal.

30. The voltage generating circuit as claimed in claim 26, wherein said internal voltage generator means comprises:

driving transistor means connected to said first terminal, for providing said internal voltage signal having the amplitude substantially equal to the amplitude of said external voltage, when said reference voltage controller means disables transmission of said reference voltage, said driving transistor means having a first electrode of a principal electrically conducting channel connected to said first terminal, a second electrode of a principal electrically conducting channel connected to said output terminal and a control electrode responsive to operation of said pull-up transistor of said reference voltage controller means; and differential amplifier means connected to said first terminal, for providing said internal voltage signal having the amplitude substantially equal to the amplitude of said reference voltage, when said reference voltage controller means enables transmission of said reference voltage.

31. A voltage generating circuit for a semiconductor memory device, comprising:

means for receiving an external voltage;

voltage sensor means for generating a sensed voltage signal by sensing an applied voltage;

reference voltage generator means for generating a reference voltage;

internal voltage generator means for generating an internal voltage at an output terminal; and reference voltage controller means for controlling generation of said internal voltage having an amplitude substantially equal to the amplitude of one said external voltage and said external voltage in dependence upon said sensed voltage signal, said reference voltage controller means comprising:

gate means disposed between said reference voltage generator means and said internal voltage generator means, for enabling transmission of said reference voltage to said internal voltage generator means in dependence upon said sensed voltage signal; and transistor means for alternatively enabling transmission of said reference voltage and said external power voltage to said internal voltage generator means in dependence upon said sensed voltage signal.

32. The voltage generating circuit as claimed in claim 31, wherein said voltage sensor means comprises:

a plurality of diode-connected transistors serially connected between an input terminal receiving said applied voltage and a common node, for reducing amplitudes of said applied voltage;

a resistor disposed between said common node and a second terminal;

a switching transistor having a first electrode of a principal electrically conducting channel connected to said common node via a plurality of serially connected inverters, a second electrode of said principal electrically conducting channel providing a switched signal upon responding to said applied voltage, and a control electrode coupled to receive said sensed voltage signal; and latching means for latching the switched signal to produce said sensed voltage signal.

33. The voltage generating circuit as claimed in claim 31, wherein said voltage sensor means comprises:

a plurality of diode-connected transistors serially connected between an input terminal receiving said applied voltage and a common node, for reducing an amplitude of said applied voltage;

a resistor disposed between said common node and a second terminal; and a plurality of serially connected inverters connected to said common node, for producing said sensed voltage signal.

34. The voltage generating circuit as claimed in claim 31, wherein said internal voltage generator means comprises:

driving transistor means for providing said internal voltage signal having the amplitude substantially equal to the amplitude of said external voltage, when said reference voltage controller means disables transmission of said reference voltage, said driving transistor means having a first electrode of a principal electrically conducting channel coupled to receive said external voltage, a second electrode of a principal electrically conducting channel connected to said output terminal and a control electrode responsive to operation of said transistor means of said reference voltage controller means; and differential amplifier means for providing said internal voltage signal having the amplitude substantially equal to the amplitude of said reference voltage, when said reference voltage controller means enables transmission of said reference voltage.

* * * * *